US008809877B2

(12) United States Patent
Guo (10) Patent No.: US 8,809,877 B2
(45) Date of Patent: Aug. 19, 2014

(54) SEMICONDUCTOR VOLTAGE TRANSFORMATION STRUCTURE

(71) Applicant: Lei Guo, Beijing (CN)

(72) Inventor: Lei Guo, Beijing (CN)

( * ) Notice: Subject to any disclaimer, the term of this patent is extended or adjusted under 35 U.S.C. 154(b) by 0 days.

(21) Appl. No.: 13/823,627

(22) PCT Filed: Nov. 9, 2012

(86) PCT No.: PCT/CN2012/084417
§ 371 (c)(1),
(2), (4) Date: Mar. 14, 2013

(87) PCT Pub. No.: WO2013/067969
PCT Pub. Date: May 16, 2013

(65) Prior Publication Data
US 2013/0181208 A1 Jul. 18, 2013

(30) Foreign Application Priority Data

Nov. 10, 2011 (CN) .......................... 2011 1 0356005
Sep. 5, 2012 (CN) .......................... 2012 1 0326608

(51) Int. Cl.
| | | |
|---|---|---|
| H01L 27/15 | (2006.01) | |
| H01L 29/26 | (2006.01) | |
| H01L 31/12 | (2006.01) | |
| H01L 33/00 | (2010.01) | |
| H01L 29/06 | (2006.01) | |
| H01L 31/0328 | (2006.01) | |
| H01L 31/0336 | (2006.01) | |
| H01L 31/072 | (2012.01) | |
| H01L 31/109 | (2006.01) | |

(52) U.S. Cl.
USPC 257/80; 257/21; 257/E31.095; 257/E31.115; 257/E33.076; 257/E33.077

(58) Field of Classification Search
USPC ..................... 257/21, 80, E31.095, E31.115, 257/E33.076, E33.077
See application file for complete search history.

(56) References Cited

U.S. PATENT DOCUMENTS 3,790,867 A * 2/1974 Hayakawa .................... 345/207
5,009,719 A * 4/1991 Yoshida ........................ 136/249

(Continued)

FOREIGN PATENT DOCUMENTS

| CN | 1993836 A | 7/2007 |
|---|---|---|
| CN | 101257055 A | 9/2008 |

(Continued)

OTHER PUBLICATIONS

International Search Report and Written Opinion dated Feb. 28, 2013 for corresponding International Application No. PCT/CN2012/084417, filed Nov. 9, 2012.

*Primary Examiner* — Ida M Soward
(74) *Attorney, Agent, or Firm* — David D. Brush; Westman, Champlin & Koehler, P.A.

(57) ABSTRACT

A semiconductor voltage transformation structure is provided. The semiconductor voltage transformation structure includes: a first electrode layer ; an electricity-to-light conversion layer formed on the first electrode layer; a second electrode layer formed on the electricity-to-light conversion layer; a first isolation layer formed on the second electrode layer; a third electrode layer formed on the first isolation layer; a light-to-electricity conversion layer formed on the third electrode layer; and a fourth electrode layer formed on the light-to-electricity conversion layer, in which the first isolation layer, the second electrode layer and the third electrode layer are transparent to a working light emitted by the electricity-to-light conversion layer.

23 Claims, 5 Drawing Sheets

(56) References Cited

U.S. PATENT DOCUMENTS

| | | | |
|---|---|---|---|
| 5,935,727 A * | 8/1999 | Chiao | 429/465 |
| 5,981,931 A | 11/1999 | Kinno et al. | |
| 6,121,541 A * | 9/2000 | Arya | 136/255 |
| 6,278,055 B1 * | 8/2001 | Forrest et al. | 136/263 |
| 7,180,098 B2 | 2/2007 | Speyer et al. | |
| 7,346,089 B2 * | 3/2008 | Ueki et al. | 372/50.124 |
| 7,964,925 B2 * | 6/2011 | Fattal et al. | 257/431 |
| 8,030,224 B2 * | 10/2011 | Taniguchi et al. | 438/795 |
| 8,129,611 B2 * | 3/2012 | Kobayashi et al. | 136/252 |
| 8,208,818 B2 | 6/2012 | Sasai | |
| 2003/0025076 A1 | 2/2003 | Takagi et al. | |
| 2003/0122228 A1 | 7/2003 | Nagase et al. | |
| 2004/0246032 A1 | 12/2004 | Ogiso et al. | |
| 2006/0285566 A1 * | 12/2006 | Ueki | 372/45.01 |
| 2007/0120045 A1 * | 5/2007 | Yokoyama | 250/214 R |
| 2008/0224132 A1 * | 9/2008 | Forrest et al. | 257/40 |
| 2009/0168410 A1 | 7/2009 | Tanamura et al. | |
| 2009/0206257 A1 | 8/2009 | Gunji et al. | |
| 2009/0208091 A1 | 8/2009 | Hayakawa et al. | |
| 2009/0208221 A1 | 8/2009 | Sasai | |
| 2010/0229912 A1 * | 9/2010 | Eo et al. | 136/244 |
| 2011/0108856 A1 * | 5/2011 | Wu et al. | 257/80 |
| 2011/0126889 A1 | 6/2011 | Bourke, Jr. et al. | |
| 2011/0174358 A1 | 7/2011 | Shin et al. | |
| 2011/0174366 A1 * | 7/2011 | Frolov et al. | 136/255 |
| 2011/0233701 A1 | 9/2011 | Mitsui et al. | |
| 2011/0315877 A1 | 12/2011 | Isozaki et al. | |
| 2012/0249864 A1 | 10/2012 | Robinson et al. | |
| 2013/0049927 A1 | 2/2013 | Ichimori | |

FOREIGN PATENT DOCUMENTS

| | | |
|---|---|---|
| CN | 102005978 A | 4/2011 |
| CN | 201893715 U | 7/2011 |
| CN | 201893718 U | 7/2011 |
| CN | 102427094 A | 4/2012 |
| CN | 102496649 A | 6/2012 |
| CN | 102569488 A | 7/2012 |
| CN | 102569489 A | 7/2012 |
| CN | 202503017 U | 10/2012 |
| CN | 202523745 U | 11/2012 |
| JP | H01311841 A | 12/1989 |
| JP | 2007294630 A | 11/2007 |

* cited by examiner

SEMICONDUCTOR VOLTAGE TRANSFORMATION STRUCTURE

CROSS-REFERENCE TO RELATED APPLICATIONS

This Application is a Section 371 National Stage Application of International Application No. PCT/CN2012/084417, filed Nov. 9, 2012, which is incorporated by reference in its entirety and has not yet been published.

This application claims priority to and benefits of the following applications:

1) Chinese Patent Application Serial No. 201110356005.4, filed with the State Intellectual Property Office of P. R. China on Nov. 10, 2011; and 2) Chinese Patent Application Serial No. 201210326608.4, filed with the State Intellectual Property Office of P. R. China on Sep. 5, 2012.

The entire contents of the above applications are incorporated herein by reference.

FIELD

The present disclosure relates to a current and voltage transformation field, and more particularly to a semiconductor voltage transformation structure.

BACKGROUND

An AC (alternating current) electric power transmission is applied to most conventional electric power systems because of a convenience of an AC voltage transformation, by using an electromagnetic field as an energy transmission medium and achieving voltage transformation, especially the transformation from a low voltage to a high voltage, according to an electromagnetic induction principle by coupling a primary coil and a secondary coil with different numbers of turns. Compared with an AC, a DC has huge advantages in terms of a transmission loss, a stability of a grid and a cost. For a DC voltage transformer, particularly for a DC voltage step-up transformer, however, a simple and efficient boosting technology and a device thereof have not been proposed for a long time. With a technology development, in one aspect, power generation technologies such as a solar cell or a fuel cell, which directly generate DC electric power, hold a larger and larger proportion to the whole electric power of the world; in another aspect, electric equipments such as LED bulbs, OLED, LED TVs, LED displays and other household electric appliances which use a DC electric power are increasing. A usual scheme of DC power generation, transmission and application, which is complex and explained as "DC power generation, conversion from DC to AC, AC transformation, AC high voltage transmission, AC transformation, conversion from AC to DC, and then DC application", has following disadvantages.

1. A required apparatus has complicated structure, numerous elements, large volume and high cost.

2. There is energy loss to different extents in each procedure, such as voltage transformation loss, current transformation loss, transmission loss, drive loss resulting from reconversion to DC at a user side, etc., thus causing low total energy transmission efficiency 3. During a process of AC high voltage transmission, it is difficult to allow a complete synchronization of AC phases among different power generation systems, thus causing a serious stability problem of the whole power grid.

In contrast, a scheme of "DC power generation, DC transformation, DC high voltage transmission, DC transformation, and then DC application" is simpler, more stable, and more reliable, and has less energy loss. In order to popularize the DC power generation and transmission, developments of DC transformation technologies and DC transformers are becoming a focus.

SUMMARY

The present disclosure is aimed to solve at least one of the problems. Accordingly, a semiconductor voltage transformation structure is provided.

According to an embodiment of the present disclosure, a semiconductor voltage transformation structure is provided. The semiconductor voltage transformation structure comprises: a first electrode layer; an electricity-to-light conversion layer formed on the first electrode layer; a second electrode layer formed on the electricity-to-light conversion layer; a first isolation layer formed on the second electrode layer; a third electrode layer formed on the first isolation layer; a light-to-electricity conversion layer formed on the third electrode layer; and a fourth electrode layer formed on the light-to-electricity conversion layer, in which the first isolation layer, the second electrode layer and the third electrode layer are transparent to a working light emitted by the electricity-to-light conversion layer; the first electrode layer, the electricity-to-light conversion layer and the second electrode layer form a semiconductor electricity-to-light conversion structure; and the third electrode layer, the light-to-electricity conversion layer and the fourth electrode layer form a semiconductor light-to-electricity conversion structure.

In one embodiment, the semiconductor voltage transformation structure further comprises: a first reflecting layer between the first electrode layer and the electricity-to-light conversion layer; and a second reflecting layer between the fourth electrode layer and the light-to-electricity conversion layer. A light is constrained to reflect forward and backward between the electricity-to-light conversion layer and the light-to-electricity conversion layer by the first reflecting layer and the second reflecting layer so as to prevent a leakage of the light, thus reducing a loss of a light.

In one embodiment, each of the first reflecting layer and the second reflecting layer is a Bragg reflector structure or an omnidirectional metal reflector structure.

In one embodiment, each of the first electrode layer and the fourth electrode layer is a metal electrode.

In one embodiment, a material of the first isolation layer is any one of $Al_2O_3$, AlN, $SiO_2$, MgO, $Si_3N_4$, BN, diamond, $ZrO_2$, $TiO_2$, $LiAlO_2$, $LiGaO_2$, semi-insulating GaAs, semi-insulating SiC, semi-insulating GaP, GaN and a combination thereof; or any one of a rare earth oxide and a combination of different rare earth oxides, so as to enable the first isolation layer to be transparent to the working light, and have a good insulation property to withstand a high voltage.

In one embodiment, an isolation between the semiconductor electricity-to-light conversion structure and the first isolation layer and/or an isolation between the semiconductor light-to-electricity conversion structure and the first isolation layer is realized by a reverse biased PN junction structure.

In one embodiment, a material of the first isolation layer is a semiconductor material of a first doping type, at least one semiconductor electricity-to-light conversion structure is formed on one side of the first isolation layer, and at least one semiconductor light-to-electricity conversion structure is formed on the other side of the first isolation layer, a doped region of a second doping type is formed between the first isolation layer and each semiconductor electricity-to-light conversion structure and between the first isolation layer and each semiconductor light-to-electricity conversion structure respectively, and a PN junction structure formed between the first isolation layer and the doped regions is reverse biased.

In one embodiment, a material of the first isolation layer is a semiconductor material of a first doping type, at least one semiconductor electricity-to-light conversion structure is formed on one side of the first isolation layer, and at least one semiconductor light-to-electricity conversion structure is formed on the other side of the first isolation layer, each semiconductor electricity-to-light conversion structure comprises a first semiconductor doped layer, the electricity-to-light conversion layer and a second semiconductor doped layer contacting with the first isolation layer, the first semiconductor doped layer is of a first doping type, the second semiconductor doped layer is of a second doping type, and a PN junction structure formed by the first isolation layer and the second semiconductor doped layer is reverse biased, each semiconductor light-to-electricity conversion structure comprises a third semiconductor doped layer, the light-to-electricity conversion layer and a fourth semiconductor doped layer contacting the first isolation layer, the third semiconductor doped layer is of the first doping type, the fourth semiconductor doped layer is of the second doping type, and a PN junction structure formed by the first isolation layer and the fourth semiconductor doped layer is reverse biased.

In one embodiment, a material of the first isolation layer is a semiconductor material; at least one semiconductor electricity-to-light conversion structure is formed on one side of the first isolation layer, and at least one semiconductor light-to-electricity conversion structure is formed on the other side of the first isolation layer; the first isolation layer has a plurality of semiconductor doped layers, and at least two sets of adjacent semiconductor doped layers have opposite doping types to form at least two PN junctions, and the at least two PN junctions are reverse biased.

In one embodiment, the semiconductor material is any one of GaP, GaAs, InP, GaN, Si, Ge, GaSb, other semiconductor material transparent to the working light, and a combination thereof.

In one embodiment, refractive indices of materials are increased in an order from the electricity-to-light conversion layer to the second electrode layer and to the first isolation layer and to the third electrode layer and to the light-to-electricity conversion layer, which means that the refractive index of material of each layer is not required to be larger than that of a former layer thereof, that is, the refractive indices of materials of some layers may be same with that of a former layer thereof, while the refractive index of material of respective layer increases overall. In one aspect, a total reflection, which occurs when a light (including a light emitted by the electricity-to-light conversion layer and a light reflected by respective electrode layer and respective reflecting layer) is transmitted from the electricity-to-light conversion layer to the light-to-electricity conversion layer, may be avoided to increase the transmission efficiency of the light. In another aspect, a total reflection, which occurs when a light (including a light emitted by the light-to-electricity conversion layer and a light reflected by the third electrode layer, the fourth electrode layer and the second reflecting layer) is transmitted from the light-to-electricity conversion layer to the electricity-to-light conversion layer, may be promoted to trap more lights in the light-to-electricity conversion layer, thus improving a light-to-electricity conversion efficiency.

In one embodiment, refractive indices of materials of the electricity-to-light conversion layer, the second electrode layer, the first isolation layer, the third electrode layer, and the light-to-electricity conversion layer are approximate. Respective internal layer is preferably selected as materials with same or approximate refractive indices to reduce a reflection and a loss of the light.

In one embodiment, at least one of the electricity-to-light conversion layer, the second electrode layer, the first isolation layer, the third electrode layer, and the light-to-electricity conversion layer has a roughened surface, a patterned surface or a photonic crystal structure to increase a transmittance of the light and reduce the total reflection of the light.

In one embodiment, a bandgap energy ($E_g$) of each of the second electrode layer, the first isolation layer, the third electrode layer is greater than a photon energy of the working light emitted from the electricity-to-light conversion layer to prevent an absorption of the working light by the second electrode layer, the first isolation layer and the third electrode layer, thus improving the transmission efficiency of the light.

In one embodiment, the electricity-to-light conversion layer comprises a light emitting diode structure, a resonant cavity light emitting diode structure, or a laser diode structure.

In one embodiment, a material of the electricity-to-light conversion layer comprises any one of AlGaInP, GaN, InGaN, InGaN, AlGaInN, ZnO, AlGaInAs, GaAs, InGaAs, InGaAsP, AiGaAs, AlGaInSb, InGaAsNSb, other groups III-V and II-VI semiconductor materials and a combination thereof, organic light emitting materials and quantum dot light emitting materials.

In one embodiment, a material of the light-to-electricity conversion layer comprises any one of AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials and a combination thereof, organic photovoltaic materials and quantum dot photovoltaic materials.

In one embodiment, energy band structures of the electricity-to-light conversion layer and the light-to-electricity conversion layer are matched with each other so that a wave spectrum of the working light emitted by the electricity-to-light conversion layer is matched with a wave spectrum of the light-to-electricity conversion layer with a maximum absorption efficiency to achieve a maximum of the transmission efficiency of the light.

In one embodiment, a material of each of the second electrode layer and the third electrode layer comprises any one of heavily doped semiconductor materials including GaAs, GaN, GaP, AlGaInP, AlGaInN, AlGaInAs, transparent conductive oxide materials including ITO (indium tin oxide), $SnO_2$, ZnO and a combination thereof.

In one embodiment, each of the electricity-to-light conversion layer and the light-to-electricity conversion layer is a multi-layer and multi-junction structure.

In one embodiment, the semiconductor voltage transformation structure may further comprise: a second isolation layer formed on the fourth electrode layer; and a second semiconductor electricity-to-light conversion structure having a same structure with the first semiconductor electricity-to-light conversion structure and formed on the second isolation layer.

In one embodiment, the semiconductor voltage transformation structure may further comprise: a third isolation layer formed under the first electrode layer; and a second semiconductor light-to-electricity conversion structure having a same structure with the first semiconductor light-to-electricity conversion structure and formed under the third isolation layer.

With the semiconductor voltage transformation structure according to an embodiment of the present disclosure, by disposing the electricity-to-light conversion layer at an input end of the semiconductor voltage transformation structure and making use of light generated by carrier transitions between energy level, a DC electricity is converted into a light for transmission; and by disposing the light-to-electricity conversion layer at an output end of the semiconductor voltage transformation structure, the light is converted back into a DC electricity for outputting. Moreover, because unit voltages of the input end and the output end are dependent on material characteristics of the electricity-to-light conversion layer and the light-to-electricity conversion layer respectively, a DC voltage transformation may be realized directly by the semiconductor voltage transformation structure. In addition, the semiconductor voltage transformation structure further has advantages of high voltage withstand, non-electromagnetic radiation, non-coil structure, non-influence of a solar radiation and a solar storm, safety and reliability, small volume, long lifetime, light weight, convenient installation and maintenance, etc.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Embodiments of the present disclosure will be described in detail in the following descriptions, examples of which are shown in the accompanying drawings, in which the same or similar units and units having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

An essential idea of the present disclosure is to provide a semiconductor voltage transformation structure. At an input end, carriers injected in a semiconductor material are recombined to generate photons. The photons are transmitted to a semiconductor material and excite out non-equilibrium carriers at an output end. The carriers are separated by an internal electric field and be outputted. In this way, an energy transmission and a voltage transformation are realized.

In order to make those skilled in the art better understand the present disclosure, principles of the prior art and the present disclosure are illustrated herein. A conventional AC transformer follows an electromagnetic theory, while the semiconductor voltage transformation structure follows a quantum theory. Photons emitted by bound electron transitions between the energy bands in semiconductors are the energy transmission media, instead of an electromagnetic fields generated by free electrons oscillating in conductors. A particle behavior must therefore be considered, rather than a wave behavior, in an analysis of a fundamental working principle of this semiconductor voltage transformation structure. In the semiconductor voltage transformation structure, an individual photon energy corresponds to the device characteristic voltage, while a number of photons corresponds to a current flowing through a device.

The DC transformer power conversion efficiency is determined by the electricity-to-light conversion efficiency, the light-to-electricity conversion efficiency, and the light losses. The electricity-to-light conversion efficiency and light-to-electricity conversion efficiency have already reached very high levels in current light-emitting and photovoltaic devices. With the development of high quality materials and advanced device structures, the internal quantum efficiencies (IQE), which indicate the conversion efficiencies between photons (light) and electrons (electricity) for both kinds of device, have improved greatly. For LEDs, IQE values of 80% for blue GaN LEDs, and nearly 100% for red AlGaInP LEDs have been achieved; and for photovoltaic devices, nearly 99% for GaAs and more than 97% for InGaN have been reported. The low efficiencies in LEDs are largely because of the refractive index mismatch between the LED and air, and the low efficiencies in photovoltaic cells for solar power applications are largely because of the spectral mismatch between the solar spectrum and the absorption spectrum of the cells. The light loss therefore becomes the most important factor in determining the efficiency of DC transformers, provided that state-of-the-art light-emitting devices and photovoltaic devices are used. Three technologies are provided in the present disclosure to reduce the light loss as far as possible, thus improving the energy conversion efficiency. The three technologies are: a spectrum matching between an emitting spectrum of the electricity-to-light conversion structure and an absorption spectrum of the light-to-electricity conversion structure to reduce a non-absorption loss of the photons and a thermalization loss, a refractive indices matching of materials on a light transmission path to reduce a total reflection loss and a Fresnel loss, and a light trap to reduce the energy loss caused by a light leakage. The three technologies will be illustrated in detail hereinafter.

Figure 1:
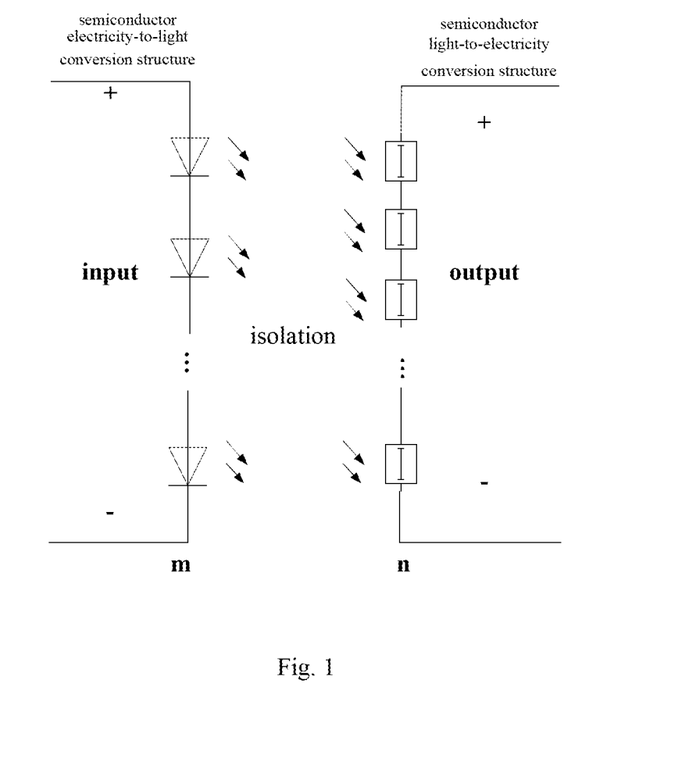
FIG. 1 is a schematic working principle diagram of a semiconductor voltage transformation structure according to an embodiment of the present disclosure.

According to an embodiment of the present disclosure, a semiconductor voltage transformation structure is provided. A working principle of the semiconductor voltage transformation structure may be shown in FIG. 1. A DC voltage $V_1$ is applied to individual semiconductor electricity-to-light conversion structure at the input end so as to inject carriers in individual semiconductor electricity-to-light conversion structure for recombination to generate photons. The photons are transmitted to an individual semiconductor light-to-electricity conversion structure so as to excite out non-equilibrium carriers and then separated by the internal electric field, and consequently a DC voltage $V_2$ is outputted from the individual semiconductor light-to-electricity conversion structure, thus realizing the energy transmission via photons. During an energy transmission process, in one aspect, $V_1$ and $V_2$ are dependent on material characteristic parameters, such as a material type, a strain characteristic, a bandgap or a doping concentration, of the electricity-to-light conversion structures and the light-to-electricity conversion structures respectively so as to realize an optimization of an energy transmission efficiency by adjusting a corresponding characteristic parameter; in another aspect, by disposing different numbers of semiconductor electricity-to-light conversion structures and semiconductor light-to-electricity conversion structures connected in series at the input end and the output end respectively, a DC transformation may be realized by a number ratio of the electricity-to-light conversion structures to the light-to-electricity conversion structures. For example, assuming that the number of the electricity-to-light conversion structures is m, and the number of the light-to-electricity conversion structures is n, total output voltage/total input voltage=$(n*V_2)/(m*V_1)$.

In one embodiment, the semiconductor voltage transformation structure may comprise one semiconductor electricity-to-light conversion structure and a plurality of semiconductor light-to-electricity conversion structures.

In another embodiment, the semiconductor voltage transformation structure may comprise a plurality of semiconductor electricity-to-light conversion structures and one semiconductor light-to-electricity conversion structure.

In another embodiment, the semiconductor voltage transformation structure may comprise a plurality of semiconductor electricity-to-light conversion structures and a plurality of semiconductor light-to-electricity conversion structures.

In another embodiment, the semiconductor voltage transformation structure may comprise one semiconductor electricity-to-light conversion structure and one semiconductor light-to-electricity conversion structure.

In following description, the semiconductor voltage transformation structure comprising a plurality of semiconductor electricity-to-light conversion structures and a plurality of semiconductor light-to-electricity conversion structures will be taken as an example. It should be noted that, the embodiments described herein are only explanatory and illustrative, which are used to generally understand the present disclosure. The embodiments shall not be construed to limit the present disclosure.

In one embodiment, each semiconductor electricity-to-light conversion structure comprises a light emitting diode (LED) structure, a resonant cavity light emitting diode (RC-LED) structure, or a laser diode (LD) structure, each of which may effectively convert the electric energy into the light energy with a stable and reliable working performance and less thermal effect. Moreover, the RC-LED further has advantages of a good directivity and a higher modulation speed, while the LD further has advantages of a good monochromaticity and a higher brightness.

In one embodiment, a material of the electricity-to-light conversion layer comprises any one of AlGaInP, GaN, InGaN, InGaN, AlGaInN, ZnO, AlGaInAs, GaAs, InGaAs, InGaAsP, AlGaAs, AlGaInSb, InGaAsNSb, other groups II-V and II-VI semiconductor materials and a combination thereof, organic light emitting materials and quantum dot light emitting materials. Specifically, the material of the electricity-to-light conversion layer may comprise any one of AlGaInP in a red-to-yellow wavelength range; GaN and InGaN in an ultraviolet wavelength range; InGaN, AlGaInN, and ZnO in a blue-to-violet wavelength range; AlGaInAs, GaAs, InGaAs, InGaAsP, AlGaAs, and InGaAsNSb in a red wavelength range or an infrared wavelength range; other group III nitride compounds, group III arsenide compounds or phosphide compounds; and a combination thereof; organic light emitting materials and quantum dot light emitting materials.

In one embodiment, each semiconductor light-to-electricity conversion structure is a photovoltaic cell structure having a back contact or a buried contact, with positive and negative electrodes led out from a same surface of the photovoltaic cell structure, which may prevent an illuminated surface of the photovoltaic cell structure from being shaded by the electrodes so as to increase the energy conversion efficiency. A material of the light-to-electricity conversion layer comprises any one of AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials and a combination thereof, organic photovoltaic materials and quantum clot photovoltaic materials.

It should be noted that the spectrum matching between the emitting spectrum of the electricity-to-light conversion layer and the absorption spectrum of the light-to-electricity conversion layer means that a characteristic of a light emitted by the electricity-to-light conversion layer is matched with that of a light with optimized light-to-electricity conversion efficiency of the light-to-electricity conversion layer so as to increase the energy conversion efficiency of the semiconductor voltage transformation structure and reduce an energy loss of photons in a conversion process. Specifically, the light emitted by the electricity-to-light conversion layer may be a monochromatic light whose wavelength is corresponding to a maximum absorption wavelength of the light-to-electricity conversion layer, and also may be a light with another specific wavelength which may enable the photovoltaic effect with a quantum efficiency in the light-to-electricity conversion layer to be larger than 1. One optimized case is that the photon energy of the light emitted by the electricity-to-light conversion layer should be just absorbed by the light-to-electricity conversion layer, but should not be over large to cause an excess thermalization loss. One possible ideal case is that a bandgap energy of an active material of the electricity-tolight conversion layer is substantially equal to that of the light-to-electricity conversion layer so as to not only ensure the light absorption, but also not cause the excess thermalization loss. It should be noted that, in this embodiment, the monochromatic light has certain spectrum width (for instance, the red light LED has a spectrum width of about 20 nm) rather than are limited to some specific frequency point.

Figure 2:
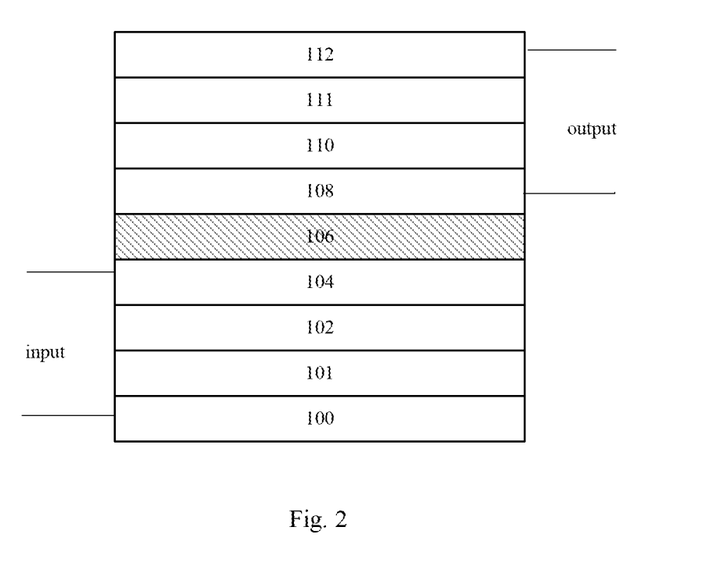
FIG. 2 is a cross-sectional view of a semiconductor voltage transformation structure according to an embodiment of the present disclosure.

FIG. 2 is a cross-sectional view of the semiconductor voltage transformation structure according to an embodiment of the present disclosure. The semiconductor voltage transformation structure comprises: a first electrode layer 100; an electricity-to-light conversion layer 102 formed on the first electrode layer 100; a second electrode layer 104 formed on the electricity-to-light conversion layer 102; a first isolation layer 106 formed on the second electrode layer 104; a third electrode layer 108 formed on the first isolation layer 106; a light-to-electricity conversion layer 110 formed on the third electrode layer 108; and a fourth electrode layer 112 formed on the light-to-electricity conversion layer 110.

The electricity-to-light conversion layer 102 is for converting an input DC electricity into the working light in a desired wavelength range. The working light comprises one or more wave bands in a whole spectral range from an ultraviolet light of 100 nm wavelength to an infrared light of 10 μm wavelength. The monochromatic light, such as a red light of 620 nm, an infrared light of 850 nm, 940 nm, 1100 nm and 1550 nm, a blue light of 460 nm or a violet light of 380 nm, is preferred to fabricate the electricity-to-light conversion layer in a mature prior art. For example, a structure and a material with high quantum efficiency and high electricity-to-light conversion efficiency may be used for forming the electricity-to-light conversion layer 102. Specifically, the electricity-to-light conversion layer 102 may be a LED structure or a laser structure generally including an active layer, a cladding layer, a current spreading layer, a P or N contact layer, etc, in which the active layer may be a multi-quantum well structure. The electricity-to-light conversion layer with the laser structure may further comprise a resonant cavity, and the electricity-to-light conversion layer with the LED structure may further comprise a resonant cavity LED structure. A material of each electricity-to-light conversion layer 102 may be selected based on material characteristics (such as defect density, or energy band structure) and required light spectrum characteristics (such as wavelength range). For example, the material of the electricity-to-light conversion layer 102 comprises any one of AlGaInP in a red-to-yellow wavelength range; GaN and InGaN in an ultraviolet wavelength range; InGaN, AlGaInN, and ZnO in a blue-to-violet wavelength range; AlGaInAs, GaAS, InGaAs, InGaAsP, and AlGaAs in a red wavelength range or an infrared wavelength range; other group III nitride compounds, group III arsenide compounds or phosphide compounds; and a combination thereof, in which the material with low defect density and high electricity-to-light conversion efficiency (such as AlGaInP, InGaN, or GaN) is preferred.

The light-to-electricity conversion layer 110 is for converting the light into an electricity to realize the transformation. A material of the light-to-electricity conversion layer 110 comprises any one of AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials and a combination thereof, organic photovoltaic materials and quantum dot photovoltaic materials. The material of the light-to-electricity conversion layer 110 is generally selected from the direct bandgap semiconductor material, and thus an energy band structure of the electricity-to-light conversion layer 102 is matched with that of the light-to-electricity conversion layer 110, so as to allow the spectrum of the working light emitted by the electricity-to-light conversion layer 102 to be matched with a spectrum with a maximum absorption efficiency of the light-to-electricity conversion layer 110, to achieve a maximum light-to-electricity conversion efficiency.

The first isolation layer 106, the second electrode layer 104 and the third electrode layer 108 are transparent to the working light emitted by the electricity-to-light conversion layer 102. In this embodiment, a bandgap energy of a material of each of the second electrode layer 104, the first isolation layer 106 and the third electrode layer 108 should be larger than the photon energy of the working light emitted by the electricity-to-light conversion layer 102 so as to prevent the second electrode layer 104, the first isolation layer 106 and the third electrode layer 108 from absorbing the working light, thus improving the light transmission efficiency.

In one embodiment, the refractive indices of materials of the first isolation layer 106, the second electrode layer 104 and the third electrode layer 108 may be matched with the refractive index of the material of the electricity-to-light conversion layer 102 and the light-to-electricity conversion layer 110 to avoid the total reflection occurring at each interface during the light transmission process. Because the total reflection occurs if and only if a light enters from a material with a larger refractive index to a material with a smaller refractive index, in a preferred embodiment, the refractive indices of materials of the second electrode layer 104, the first isolation layer 106, the third electrode layer 108 and the light-to-electricity conversion layer 110 are approximate to avoid the total reflection occurring at each interface when the light is transmitted from the electricity-to-light conversion layer 102 to the light-to-electricity conversion layer 110. In another more preferred embodiment, refractive indices of materials are increased in an order from the second electrode layer 104 and to the first isolation layer 106 and to the third electrode layer 108 and to the light-to-electricity conversion layer 110. "Increased in an order" means that the refractive index of material of each layer is not less than that of a former layer thereof, that is, the refractive indices of materials of some layers may be same with that of a former layer thereof, while the refractive index of material of respective layer increases overall. In yet another more preferred embodiment, the refractive indices of materials of the second electrode layer 104, the first isolation layer 106, the third electrode layer 108 and the light-to-electricity conversion layer 110 are increased gradually. In one aspect, a total reflection, which occurs when a light (including a light emitted by the electricity-to-light conversion layer 102 and a light reflected by respective electrode layer and respective reflecting layer) is transmitted from the electricity-to-light conversion layer 102 to the light-to-electricity conversion layer 110, may be avoided to increase the transmission efficiency of the light. In another aspect, a total reflection, which occurs when a light (including a light emitted by the light-to-electricity conversion layer 110 and a light reflected by the third electrode layer, the fourth electrode layer and the second reflecting layer) is transmitted from the light-to-electricity conversion layer to the electricity-to-light conversion layer, may be promoted to trap more lights in the light-to-electricity conversion layer, thus improving the light-to-electricity conversion efficiency.

In addition, different material layers may have roughened surfaces, patterned surfaces or photonic crystal structures so as to reduce the light transmission loss. In one preferred embodiment, at least one of the electricity-to-light conversion layer 102, the second electrode layer 104, the first isolation layer 106, the third electrode layer 110 and the light-toelectricity conversion layer 110 has a roughened surface, a patterned surface or a photonic crystal structure to increase a transmittance of light and decrease the reflection of light.

The first isolation layer 106 is used for an electrical isolation between the electricity-to-light conversion layer 102 and the light-to-electricity conversion layer 110 to allow an input voltage and an output voltage not to influence each other. Moreover, the first isolation layer 106 is transparent to the working light, to allow a light carrying energy to be transmitted from the electricity-to-light conversion layer 102 to the light-to-electricity conversion layer 110, this realizing the energy transmission and eventually realizing a voltage transformation.

In order to realize the electrical isolation, the first isolation layer 106 may be formed by a material isolation method or an electricity isolation method as follows.

(1) Isolation by Material

In the isolation by material method, the first isolation layer 106 may use an insulation material. A thickness of the first isolation layer 106 depends on the input and output voltages and an insulating requirement. The thicker the first isolation layer 106 is, the better the insulating effect is, the higher the breakdown voltage which the first isolation layer 106 may bear is, however, the larger the attenuation to the light is. Therefore, a determining principle of the thickness of the first isolation layer 106 is that the thinner the better under the conditions where the insulating requirement is met. According to the above requirement, in this embodiment, a material of the first isolation layer 106 may be any one of $Al_2O_3$, AlN, $SiO_2$, MgO, $Si_3N_4$, BN, diamond, $ZrO_2$, $TiO_2$, $LiAlO_2$, $LiGaO_2$, semi-insulating GaAs, semi-insulating SiC, semi-insulating GaP, GaN and a combination thereof; or any one of a rare earth oxide and a combination of different rare earth oxides. A material of each of the second electrode layer and the third electrode layer comprises any one of heavily doped semiconductor materials including GaAs. GaN, GaP, AlGaInP, AlGaInN, AlGaInAs, transparent conductive oxide materials including ITO, $SnO_2$, ZnO and a combination thereof.

(2) Isolation by Semiconductor Structure

In practice, an insulation material which meets requirements of a lattice matching, a refractive index matching, and a good insulation is very rare. Thus, the isolation by semiconductor structure method is provided by the present disclosure, that is, the first isolation layer 106 uses a proper semiconductor material, and an isolation between the second electrode layer 104 and the third electrode layer 108 is realized by a reverse biased PN junction structure.

Specifically, a material of the first isolation layer 106 may be any one of GaP, GaAs, InP, GaN, Si, Ge, GaSb, other semiconductor material transparent to the light, and a combination thereof. These materials of the first isolation layer 106 are easy to meet the lattice matching as well as the refractive index matching with the material (which has been mentioned hereinbefore) of the light-to-electricity conversion layer 110, the material (which has been mentioned hereinbefore) of the electricity-to-light conversion layer 102, the material (which will be mentioned hereinafter) of the second electrode layer 104 and the material (which will be mentioned hereinafter) of the third electrode layer 108. It is indicated that, for the semiconductor voltage transformation structure according to an embodiment of the present disclosure, in one aspect, an epitaxial growth process which is simple and easy to implement may be used in the fabrication process; in another aspect, the refractive indices are matched thus reducing light loss and increasing the transmission efficiency.

Figure 3A:
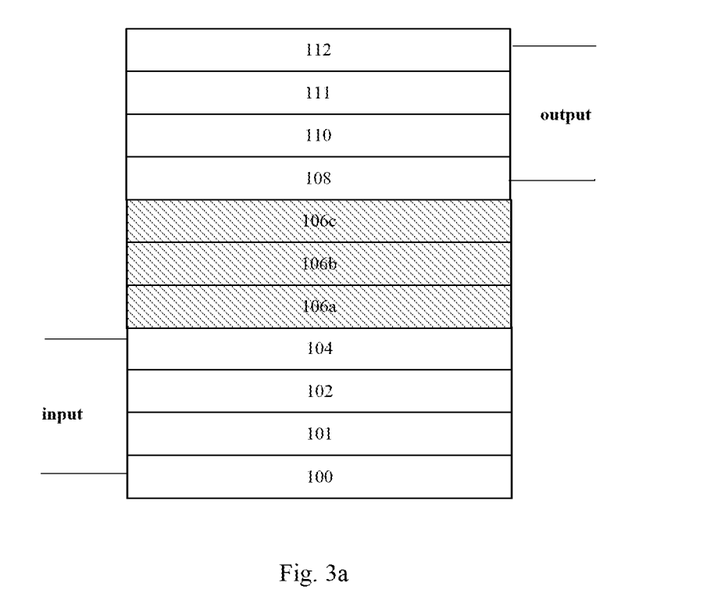
FIGS. 3a-3e are cross-sectional views of semiconductor voltage transformation structures using a semiconductor material as an isolation layer according to an embodiment of the present disclosure.
Figure 3B:
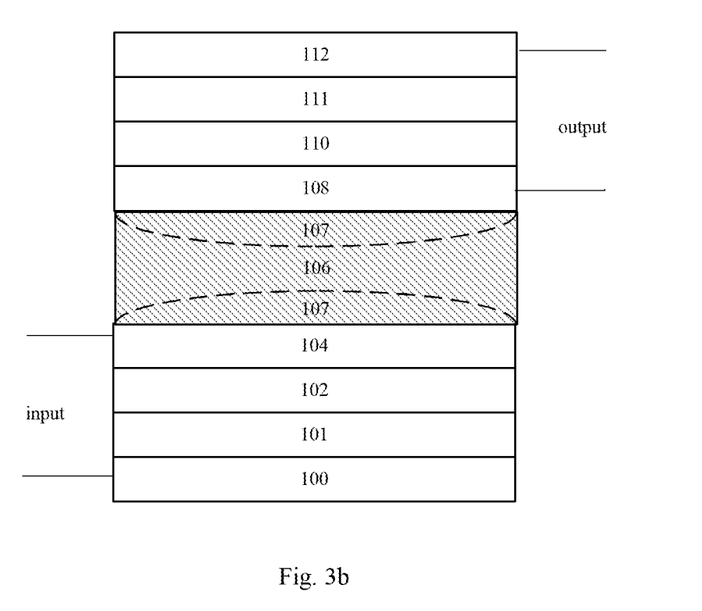

The reverse biased PN junction structure between the second electrode layer 104 and the third electrode layer 108 may be realized via various approaches. For example, as shown in FIG. 3a, the first isolation layer 106 may comprise three sub-layers to form a sandwich structure, which is usually formed by epitaxy. A first sub-layer 106a and a third sub-layer 106c are N-type (or P-type) doped and subjected to a high potential (or a low potential), and a second sub-layer 106b is P-type (or N-type) doped and subjected to a low potential (or a high potential), and thus two reverse biased PN junction structures are formed by which the carriers can not pass through the first isolation layer 106 so that both sides of the first isolation layer 106 are isolated from each other. It should be noted that a number of the first isolation layer 106 may be more than three, that is, a specific number of the first isolation layer 106 may be adjusted according to practice with ensured at least two reverse biased PN junction structures. Yet for example, as shown in FIG. 3b, the first isolation layer 106 of N type doping (or P type doping) is formed at first, and then an ion implantation or a diffusion is performed at the both sides of the first isolation layer 106 to realize a local P type doping (or N type doping), and thus two inverse type regions 107 are formed. Therefore, two reverse biased PN junction structures are formed, by which the carriers can not pass through the first isolation layer 106 so that both sides of the first isolation layer 106 are isolated from each other.

Figure 3C:
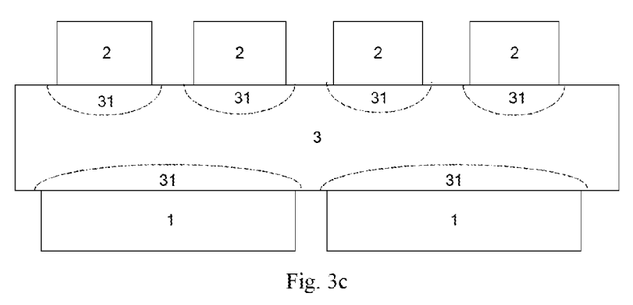

FIG. 3c is a cross-sectional view of the semiconductor voltage transformation structure according to one embodiment of the present disclosure. As shown in FIG. 3c, the semiconductor voltage transformation structure comprises two semiconductor electricity-to-light conversion structures 1 connected in series, four semiconductor light-to-electricity conversion structures 2 connected in series and an isolation layer 3. The semiconductor electricity-to-light conversion structures 1 are formed on one side of the isolation layer 3, and each semiconductor electricity-to-light conversion structure 1 comprises an electricity-to-light conversion layer 12 (not shown in FIG. 3c). The semiconductor light-to-electricity conversion structures 2 are formed on the other side of the isolation layer 3, and each semiconductor light-to-electricity conversion structure 2 comprises a light-to-electricity conversion layer 22 (not shown in FIG. 3c). The isolation layer 3 is transparent to the working light emitted by the electricity-to-light conversion layer 12, to allow the light carrying energy to be transmitted from the semiconductor electricity-to-light conversion structures 1 to the semiconductor light-to-electricity conversion structures 2, thus realizing the energy transmission and eventually realizing the voltage transformation. A material of the isolation layer 3 may be of a first doping type and any one of GaP, GaAs, InP, GaN, Si, Ge, GaSb, other semiconductor material transparent to the light, and a combination thereof. A doped region 31 of a second doping type is formed between the isolation layer 3 and the semiconductor electricity-to-light conversion structures 1 and between the isolation layer 3 and the semiconductor light-to-electricity conversion structures 2 respectively, and one PN junction structure formed by the isolation layer 3 and the doped regions 31 is reverse biased. Specifically, when the isolation layer 3 is P-type doped and the doped regions 31 are N-type doped, a low potential may be applied to the isolation layer 3 and a high potential may be applied to the doped regions 31. Or when the isolation layer 3 is N-type doped and the doped regions 31 are P-type doped, a high potential may be applied to the isolation layer 3 and a low potential may be applied to the doped regions 31. Therefore, all PN junction structures between the semiconductor electricity-to-light conversion structures 1 and the semiconductor light-to-electricity conversion structures 2 are reverse biased so that the carriers can not pass through, thus realizing the electrical isolation and avoiding interaction between the input end and the output end.

Figure 3D:
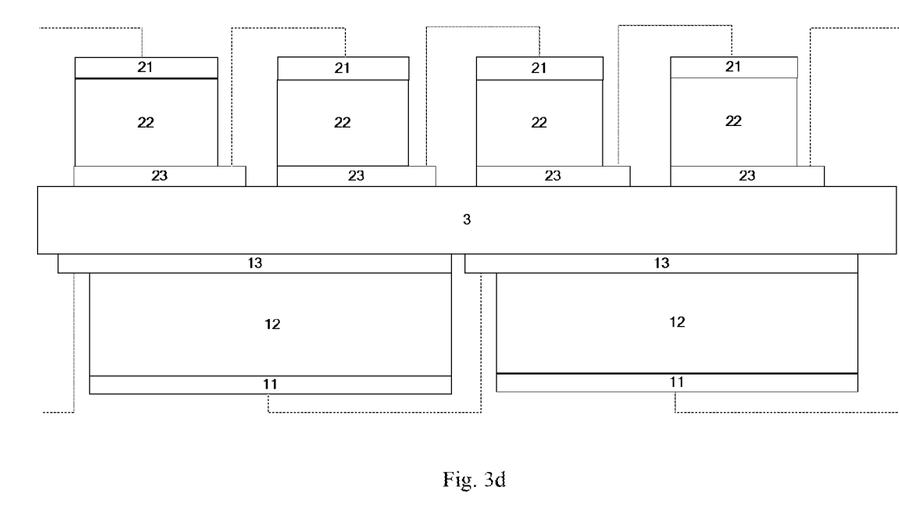

FIG. 3d is a cross-sectional view of the semiconductor voltage transformation structure according to another embodiment of the present disclosure. As shown in FIG. 3d, the semiconductor voltage transformation structure comprises two semiconductor electricity-to-light conversion structures 1 connected in series, four semiconductor light-to-electricity conversion structures 2 connected in series and an isolation layer 3. The semiconductor electricity-to-light conversion structures 1 are formed on one side of the isolation layer 3, and the semiconductor light-to-electricity conversion structures 2 are formed on the other side of the isolation layer 3. The isolation layer 3 is transparent to the working light emitted by the electricity-to-light conversion layer 12. A material of the isolation layer 3 may be of a first doping type and any one of GaP, GaAs, InP, GaN, Si, Ge, GaSb, other semiconductor material transparent to the light, and a combination thereof. Each semiconductor electricity-to-light conversion structure 1 comprises a first semiconductor doped layer 11, the electricity-to-light conversion layer 12 and a second semiconductor doped layer 13 contacting with the isolation layer 3. The first semiconductor doped layer 11 is of the first doping type, the second semiconductor doped layer 13 is of the second doping type, and a PN junction structure formed by the isolation layer 3 and the second semiconductor doped layer 13 is reverse biased. The semiconductor light-to-electricity conversion structure 2 comprises a third semiconductor doped layer 21, the light-to-electricity conversion layer 22 and a fourth semiconductor doped layer 23 contacting the isolation layer 3. The third semiconductor doped layer 21 is of the first doping type, the fourth semiconductor doped layer 23 is of the second doping type, and a PN junction structure formed by the isolation layer 3 and the fourth semiconductor doped layer 23 is reverse biased. Similar with the embodiment above, in this embodiment, all PN junction structures between the semiconductor electricity-to-light conversion structures 1 and the semiconductor light-to-electricity conversion structures 2 are reverse biased to realize the electrical isolation, thus avoiding interaction between the input end and the output end.

Figure 3E:
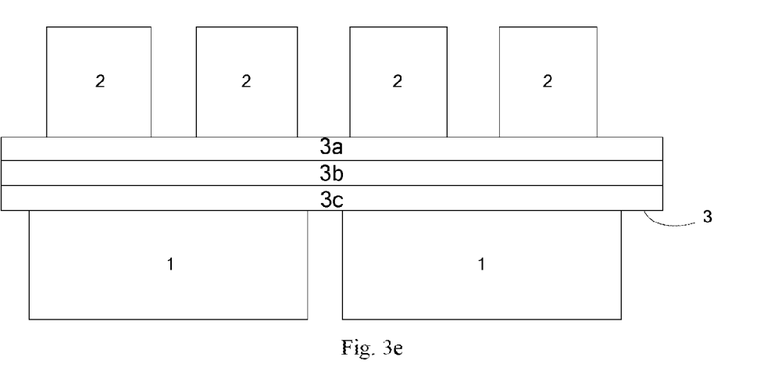

FIG. 3e is a cross-sectional view of the semiconductor voltage transformation structure according to one embodiment of the present disclosure. As shown in FIG. 3e, the semiconductor voltage transformation structure comprises two semiconductor electricity-to-light conversion structures 1 connected in series, four semiconductor light-to-electricity conversion structures 2 connected in series and an isolation layer 3. The semiconductor electricity-to-light conversion structures 1 are formed on one side of the isolation layer 3, and each semiconductor electricity-to-light conversion structure 1 comprises an electricity-to-light conversion layer 12 (not shown in FIG. 3e). The semiconductor light-to-electricity conversion structures 2 are formed on the other side of the isolation layer 3, and each semiconductor light-to-electricity conversion structure 2 comprises a light-to-electricity conversion layer 22 (not shown in FIG. 3e). The isolation layer 3 is transparent to the working light emitted by the electricity-to-light conversion layer 12, to allow the light carrying energy to be transmitted from the semiconductor electricity-to-light conversion structures 1 to the semiconductor light-to-electricity conversion structures 2, thus realizing the energy transmission and eventually realizing the voltage transformation. A material of the isolation layer 3 may be of the first doping type and any one of GaP, GaAs, InP, GaN, Si, Ge, GaSb, other semiconductor material transparent to the light, and a combination thereof. The isolation layer 3 has a plurality of semiconductor doped layers. For example, the isolation layer 106 comprises a first semiconductor doped layer 3a, a second semiconductor doped layer 3b and a third semiconductor doped layer 3c. Doping types of the first semiconductor doped layer 3a and the second semiconductor doped layer 3b are opposite, while doping types of the second semiconductor doped layer 3b and the third semiconductor doped layer 3c are opposite. Thus, a first PN junction at an interface between the first semiconductor doped layer 3a and the second semiconductor doped layer 3b and a second PN junction at an interface between the second semiconductor doped layer 3b and the third semiconductor doped layer 3c are formed between the semiconductor electricity-to-light conversion structures 1 and the semiconductor light-to-electricity conversion structures 2. Both the first PN junction and the second PN junction are reverse biased to realize the electrical isolation, thus avoiding interaction between the input end and the output end. It should be noted that the isolation layer 3 may also comprise larger number of semiconductor doped layers with ensured that at least two groups of adjacent semiconductor doped layers have opposite doping types to form at least two PN junctions and enable the at least two PN junctions to be reverse biased. The electrical isolation is thus realized to avoid interaction between the input end and the output end.

It should be noted that, in the embodiments shown in FIGS. 3a-3e, the plurality of semiconductor electricity-to-light conversion structures 1 may be located on the isolation layer 3, while the plurality of semiconductor light-to-electricity conversion structures 2 may be located under the isolation layer 3. Alternatively, the plurality of semiconductor electricity-to-light conversion structures 1 may be located under the isolation layer 3, while the plurality of semiconductor light-to-electricity conversion structures 2 may be located on the isolation layer 3. An exchange of a relative position does not substantially influence a work of the semiconductor voltage transformation structure.

In one preferred embodiment, a first reflecting layer 101 is formed between the first electrode layer 100 and the electricity-to-light conversion layer 102; and a second reflecting layer 111 is formed between the fourth electrode layer 112 and the light-to-electricity conversion layer 110. As shown in FIG. 2, a light is trapped to reflect forward and backward between the electricity-to-light conversion layer 102 and the light-to-electricity conversion layer 110 so as to form the light trap to prevent the leakage of the light, thus improving the conversion efficiency of the light. A material of a reflecting layer needs to meet requirements of high reflection efficiency to the working light, stablility, low contact resistance and good conductivity, which may be realized via a Bragg reflector structure or an omnidirectional metal reflector structure. For the Bragg reflector structure, a reflection is realized by multi-layer structure with materials of different refractive indices, for example, the reflection is realized by a multi-layer structure made of two materials with different refractive indices, such as, GaAs and AlAs with a refractive index difference of 0.6, or Si and REO (rear earth oxide) with a refractive index difference of 2.2. For the omnidirectional metal reflector structure, the reflection may be realized by depositing a metal with high electrical conductivity and high thermal conductivity. The metal may be any one of Ag, Au, Cu, Ni, In, Ti, Zn, Al, Sn, Co, W and a combination thereof. Because thicknesses of back electrode layers (i.e., the first electrode layer 100 and the fourth electrode layer 112) contacting with the reflecting layer is larger, the reflecting layer with the omnidirectional metal reflector structure also has a function of heat dissipation.

The first electrode layer 100 and the fourth electrode layer 112 are used as lead-out electrodes to input and output currents. Because the first electrode layer 100 and the fourth electrode layer 112 are not required to be transparent to the working light, the first electrode layer 100 and the fourth electrode layer 112 may be a single layer and/or a multi-layer composite structure formed by a metal, an alloy, a ceramic, a glass, a plastic, a conductive oxide, etc., in which a low resistance metal such as Cu, Au. More preferably, a thickness of a metal electrode layer may be increased to reduce the resistance and be favorable for heat dissipation.

Figure 4:
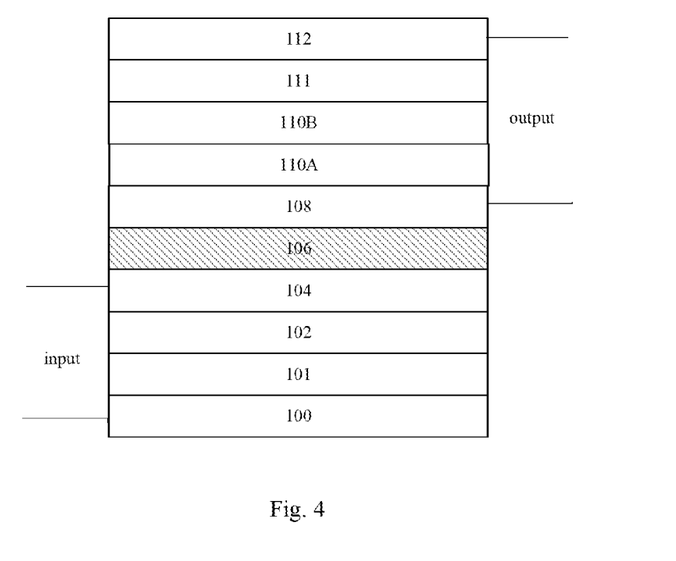
FIG. 4 is a cross-sectional view of a semiconductor voltage transformation structure including one electricity-to-light conversion layer and two light-to-electricity conversion layers according to an embodiment of the present disclosure.

It should be noted that an input voltage threshold and an output voltage threshold of the semiconductor voltage transformation structure are dependent on material characteristic parameters, such as a bandgap energy or a doping concentration, of the electricity-to-light conversion layer and the light-to-electricity conversion layer respectively so as to realize the voltage transformation by adjusting a corresponding characteristic parameter. Furthermore, an expected transformation may be realized by adjusting a number ratio of the electricity-to-light conversion structure 1 and the light-to-electricity conversion structure 2 to raise a voltage transformation ratio. For example, as shown in FIG. 4, the semiconductor voltage transformation structure comprises one electricity-to-light conversion layer 102 and two light-to-electricity conversion layers 110A and 110B. Compared with the semiconductor voltage transformation structure comprising a single electricity-to-light conversion layer and a single light-to-electricity conversion layer, the voltage transformation ratio is increased.

Figure 5:
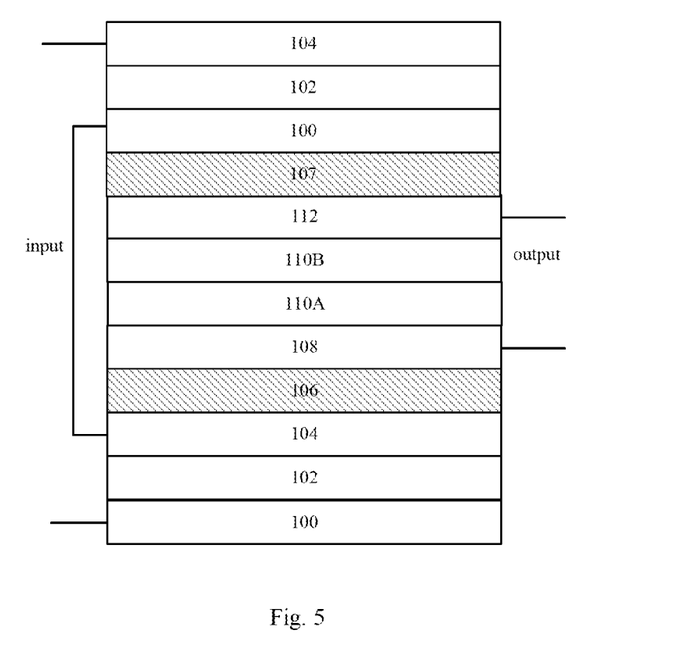
FIG. 5 is a cross-sectional view of a semiconductor voltage transformation structure including two electricity-to-light conversion structures and one light-to-electricity conversion structure according to an embodiment of the present disclosure.
Figure 6:
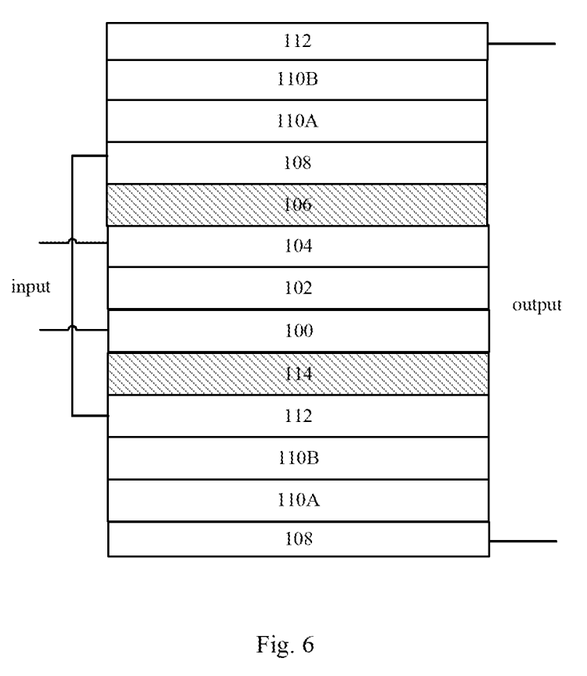
FIG. 6 is a cross-sectional view of a semiconductor voltage transformation structure including two light-to-electricity conversion structures and one electricity-to-light conversion structure according to an embodiment of the present disclosure.

In one preferred embodiment, the first electrode layer 100, the electricity-to-light conversion layer 102 formed on the first electrode layer 100, and the second electrode layer 104 formed on the electricity-to-light conversion layer 102 form one semiconductor electricity-to-light conversion structure, while the third electrode layer 108, the light-to-electricity conversion layer 110 formed on the third electrode layer 108, and the fourth electrode layer 112 formed on the light-to-electricity conversion layer 110 form one semiconductor light-to-electricity conversion structure. The semiconductor voltage transformation structure may also comprise a plurality of semiconductor electricity-to-light conversion structures and/or a plurality of semiconductor light-to-electricity conversion structures alternately stacked layer by layer. The isolation layer is formed between each adjacent semiconductor electricity-to-light conversion structure and semiconductor light-to-electricity conversion structure to further increase a DC voltage transformation ratio. The plurality of semiconductor electricity-to-light conversion structures (or the plurality of semiconductor light-to-electricity conversion structures) are connected in series. A structure of each semiconductor electricity-to-light conversion structure (or each semiconductor light-to-electricity conversion structure) may refer to the structures described in above embodiments. FIG. 5 is a cross-sectional view of the semiconductor voltage transformation structure including two electricity-to-light conversion structure and one light-to-electricity conversion structure according to an embodiment of the present disclosure. The first isolation layer 106 and a second isolation layer 107 are formed between the semiconductor electricity-to-light conversion structure and the semiconductor light-to-electricity conversion structure respectively. FIG. 6 is a cross-sectional view of a semiconductor voltage transformation structure including two light-to-electricity conversion structures and one electricity-to-light conversion structure according to an embodiment of the present disclosure. The first isolation layer 106 and a third isolation layer 114 are formed between the semiconductor electricity-to-light conversion structure and the semiconductor light-to-electricity conversion structure respectively. It should be noted that, a reflecting layer (not shown in FIG. 5 and FIG. 6) may be further formed on each of a bottom and a top of the semiconductor voltage transformation structures shown in FIG. 5 and FIG. 6 to trap the light in the semiconductor voltage transformation structure, thus improving the energy conversion efficiency. Also it should be noted that, in this semiconductor voltage transformation structure, a material of the first electrode layer and the fourth electrode layer of each middle semiconductor electricity-to-light conversion structure and semiconductor light-to-electricity conversion structure except a top and a bottom semiconductor electricity-to-light conversion structures (or the semiconductor light-to-electricity conversion structures) may be any one of a heavily doped semiconductor material, for example, GaAs, GaN, AlGaInP, AlGaInN, or AlGaInAs; transparent conductive oxide materials, for example, ITO, SnO$_2$, or ZnO; and a combination thereof; but rather than a metal so as to be favorable for the light transmission.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A semiconductor voltage transformation structure, comprising:
   a first electrode layer;
   an electricity-to-light conversion layer formed on the first electrode layer;
   a second electrode layer formed on the electricity-to-light conversion layer;
   a first isolation layer formed on the second electrode layer;
   a third electrode layer formed on the first isolation layer;
   a light-to-electricity conversion layer formed on the third electrode layer; and
   a fourth electrode layer formed on the light-to-electricity conversion layer,
   wherein the first isolation layer, the second electrode layer and the third electrode layer are transparent to a working light emitted by the electricity-to-light conversion layer;
   the first electrode layer, the electricity-to-light conversion layer and the second electrode layer form a semiconductor electricity-to-light conversion structure;
   the third electrode layer, the light-to-electricity conversion layer and the fourth electrode layer form a semiconductor light-to-electricity conversion structure; and
   a bandgap energy of each of the second electrode layer, the first isolation layer, the third electrode layer is greater than a photon energy of the working light emitted from the electricity-to-light conversion layer.

2. The semiconductor voltage transformation structure according to claim 1, further comprising:
   a first reflecting layer between the first electrode layer and the electricity-to-light conversion layer; and
   a second reflecting layer between the fourth electrode layer and the light-to-electricity conversion layer.

3. The semiconductor voltage transformation structure according to claim 2, wherein
   each of the first reflecting layer and the second reflecting layer is a Bragg reflector structure or a omnidirectional metal reflector structure.

4. The semiconductor voltage transformation structure according to claim 1, wherein each of the first electrode layer and the fourth electrode layer is a metal electrode.

5. The semiconductor voltage transformation structure according to claim 1, wherein a material of the first isolation layer is any one of $Al_2O_3$, AlN, $SiO_2$, MgO, $Si_3N_4$, BN, diamond, $ZrO_2$, $TiO_2$, $LiAlO_2$, $LiGaO_2$, semi-insulating GaAs, semi-insulating SiC, semi-insulating GaP, GaN and a combination thereof; or any one of a rare earth oxide and a combination of different rare earth oxides.

6. The semiconductor voltage transformation structure according to claim 1, wherein an isolation between the semiconductor electricity-to-light conversion structure and the first isolation layer and/or an isolation between the semiconductor light-to-electricity conversion structure and the first isolation layer is realized by a reverse biased PN junction structure.

7. The semiconductor voltage transformation structure according to claim 6, wherein
a material of the first isolation layer is a semiconductor material of a first doping type,
at least one semiconductor electricity-to-light conversion structure is formed on one side of the first isolation layer, and at least one semiconductor light-to-electricity conversion structure is formed on the other side of the first isolation layer,
a doped region of a second doping type is formed between the first isolation layer and each semiconductor electricity-to-light conversion structure and between the first isolation layer and each semiconductor light-to-electricity conversion structure respectively, and a PN junction structure formed between the first isolation layer and the doped regions is reverse biased.

8. The semiconductor voltage transformation structure according to claim 6, wherein
a material of the first isolation layer is a semiconductor material of a first doping type,
at least one semiconductor electricity-to-light conversion structure is formed on one side of the first isolation layer, and at least one semiconductor light-to-electricity conversion structure is formed on the other side of the first isolation layer,
each semiconductor electricity-to-light conversion structure comprises a first semiconductor doped layer, the electricity-to-light conversion layer and a second semiconductor doped layer contacting with the first isolation layer, the first semiconductor doped layer is of a first doping type, the second semiconductor doped layer is of a second doping type, and a PN junction structure formed by the first isolation layer and the second semiconductor doped layer is reverse biased,
each semiconductor light-to-electricity conversion structure comprises a third semiconductor doped layer, the light-to-electricity conversion layer and a fourth semiconductor doped layer contacting the first isolation layer, the third semiconductor doped layer is of the first doping type, the fourth semiconductor doped layer is of the second doping type, and a PN junction structure formed by the first isolation layer and the fourth semiconductor doped layer is reverse biased.

9. The semiconductor voltage transformation structure according to claim 6, wherein a material of the first isolation layer is a semiconductor material,
wherein at least one semiconductor electricity-to-light conversion structure is formed on one side of the first isolation layer, and at least one semiconductor light-to-electricity conversion structure is formed on the other side of the first isolation layer,
wherein the first isolation layer has a plurality of semiconductor doped layers, at least two sets of adjacent semiconductor doped layers have opposite doping types to form at least two PN junctions, and the at least two PN junctions are reverse biased.

10. The semiconductor voltage transformation structure according to claim 7, wherein the semiconductor material is any one of GaP, GaAs, InP, GaN, Si, Ge, GaSb, other semiconductor material transparent to the working light, and a combination thereof.

11. The semiconductor voltage transformation structure according to claim 1, wherein refractive indices of materials are increased in an order from the electricity-to-light conversion layer to the second electrode layer and to the first isolation layer and to the third electrode layer and to the light-to-electricity conversion layer.

12. The semiconductor voltage transformation structure according to claim 1, wherein refractive indices of materials of the electricity-to-light conversion layer, the second electrode layer, the first isolation layer, the third electrode layer, and the light-to-electricity conversion layer are approximate.

13. The semiconductor voltage transformation structure according to claim 1, wherein at least one of the electricity-to-light conversion layer, the second electrode layer, the first isolation layer, the third electrode layer, and the light-to-electricity conversion layer has a roughened surface, a patterned surface or a photonic crystal structure.

14. The semiconductor voltage transformation structure according to claim 1, wherein the electricity-to-light conversion layer comprises a light emitting diode structure, a resonant cavity light emitting diode structure, or a laser diode structure.

15. The semiconductor voltage transformation structure according to claim 1, wherein a material of the electricity-to-light conversion layer comprises any one of AlGaInP, GaN, InGaN, InGaN, AlGaInN, ZnO, AlGaInAs, GaAs, InGaAs, InGaAsP, AlGaAs, AlGaInSb, InGaAsNSb, other groups III-V and II-VI semiconductor materials and a combination thereof, organic light emitting materials and quantum dot light emitting materials.

16. The semiconductor voltage transformation structure according to claim 1, wherein a material of the light-to-electricity conversion layer comprises any one of AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials and a combination thereof, organic photovoltaic materials and quantum dot photovoltaic materials.

17. The semiconductor voltage transformation structure according to claim 1, wherein energy band structures of the electricity-to-light conversion layer and the light-to-electricity conversion layer are matched with each other so that a spectrum of the working light emitted by the electricity-to-light conversion layer is matched with a spectrum of the light-to-electricity conversion layer with a maximum absorption efficiency.

18. The semiconductor voltage transformation structure according to claim 1, wherein a material of each of the second electrode layer and the third electrode layer comprises any one of heavily doped semiconductor materials including GaAs, GaN, GaP, AlGaInP, AlGaInN, AlGaInAs, transparent conductive oxide materials including ITO, $SnO_2$, ZnO and a combination thereof.

19. The semiconductor voltage transformation structure according to claim 1, wherein each of the electricity-to-light conversion layer and the light-to-electricity conversion layer is a multi-layer and multi-junction structure.

20. The semiconductor voltage transformation structure according to claim 1, further comprising:
  a second isolation layer formed on the fourth electrode layer; and
  a second semiconductor electricity-to-light conversion structure having a same structure with the first semiconductor electricity-to-light conversion structure and formed on the second isolation layer.

21. The semiconductor voltage transformation structure according to claim 1, further comprising:
  a third isolation layer formed under the first electrode layer; and
  a second semiconductor light-to-electricity conversion structure having a same structure with the first semiconductor light-to-electricity conversion structure and formed under the third isolation layer.

22. The semiconductor voltage transformation structure according to claim 8, wherein the semiconductor material is any one of GaP, GaAs, InP, GaN, Si, Ge, GaSb, other semiconductor material transparent to the working light, and a combination thereof.

23. The semiconductor voltage transformation structure according to claim 9, wherein the semiconductor material is any one of GaP, GaAs, InP, GaN, Si, Ge, GaSb, other semiconductor material transparent to the working light, and a combination thereof.

* * * * *